United States Patent
Kuwamoto et al.

(12)

(10) Patent No.: US 6,441,083 B1
(45) Date of Patent: Aug. 27, 2002

(54) POLYAMIDIC ACID-CONTAINING AND FINE PARTICLES-DISPERSED COMPOSITION AND PRODUCTION PROCESS THEREFOR

(75) Inventors: Tomoyuki Kuwamoto, Nara; Tsuyoshi Yamashita, Suita; Hayato Ikeda, Nara, all of (JP)

(73) Assignee: Nippon Shokubai Co., Ltd. (JP)

( * ) Notice: Subject to any disclaimer, the term of this patent is extended or adjusted under 35 U.S.C. 154(b) by 0 days.

(21) Appl. No.: 09/585,385

(22) Filed: Jun. 1, 2000

(30) Foreign Application Priority Data

Jun. 11, 1999 (JP) ............................................. 11-166051
Jan. 7, 2000 (JP) ......................................... 2000-006011

(51) Int. Cl.$^7$ ................................................ C08K 3/04

(52) U.S. Cl. ........................ 524/492; 524/493; 524/495; 524/496; 524/847

(58) Field of Search ................................ 524/492, 493, 524/495, 496, 847

(56) References Cited

U.S. PATENT DOCUMENTS 5,753,306 A    5/1998   Tran
5,780,201 A    7/1998   Sabnis et al.

FOREIGN PATENT DOCUMENTS

| CA | 2031407 A1 | 6/1991 |
|---|---|---|
| EP | 0 433 265 A2 | 6/1991 |
| JP | 63-95264 A | 4/1988 |
| JP | 63-172741 A | 7/1988 |
| JP | 1-121364 A | 5/1989 |
| JP | 3-170548 A | 7/1991 |
| JP | 6-145378 A | 5/1994 |

*Primary Examiner*—Edward J. Cain
(74) *Attorney, Agent, or Firm*—Haugen Law Firm PLLP

(57) ABSTRACT

The present invention provides: a fine particles-dispersed composition that has extremely good dispersibility even if a polyamidic acid is contained in the composition; and a production process for such a composition. The polyamidic acid-containing and fine particles-dispersed composition comprises fine particles and a polar solvent solution, wherein the fine particles are dispersed in the polar solvent solution using an organic polymer as a dispersant, and this composition further comprises a polyamidic acid.

30 Claims, No Drawings

POLYAMIDIC ACID-CONTAINING AND FINE PARTICLES-DISPERSED COMPOSITION AND PRODUCTION PROCESS THEREFOR

BACKGROUND OF THE INVENTION

A. Technical Field

The present invention relates to a polyamidic acid-containing and fine particles-dispersed composition that has extremely good dispersibility of fine particles even if a polyamidic acid is contained in the composition.

B. Background Art

A polyimide resin is, for example, widely used for various molding materials (e.g. films, sheets), paints (e.g. electric wire enamel), electronic materials, flexible printed substrates, heat-resistant substrates, semiconductor-sealing materials, adhesives, and organic-inorganic-composite materials, because the polyimide resin is excellent, for example, in heat resistance, mechanical properties, chemical resistance and radioactive ray resistance.

Attempts are made to accomplish purposes of, for example, enhancing the physical properties, by adding dielectric fine particles to this polyimide resin. JP-A-172741/1988 discloses diminishing the thermal expansion coefficient by enhancing the heat resistance. JP-A-170548/1991 and JP-A-145378/1994 disclose enhancing the slipping ability and the running durability. JP-A-121364/1989 discloses giving the printability, the heat resistance, and the moisture-resistant adhesion.

In addition, a product by dispersing carbon black into the polyimide resin has light-blocking-off ability and electroconductivity, and is therefore used as a black matrix of a color filter of a liquid crystal display by utilizing the light-blocking-off ability and as an electroconductive paint, a sheet heating element or an electromagnetic wave-absorbing sheet by utilizing the electroconductivity.

A process for producing the polyimide resin, generally, comprises the steps of synthesizing a solvent-soluble polyamidic acid, and then polyimidizing it by heating at 300° C. or higher. Therefore, the step of dispersing dielectric fine particles into a solution of a polyamidic acid is necessary for dispersing the dielectric fine particles into the polyimide resin. As to processes for such dispersing, the following might be thought of: a process comprising the steps of adding dielectric fine particles to a polyamidic acid solution and then dispersing the dielectric fine particles into the polyamidic acid solution with a dispersing machine such as sand mill or ball mill; and a direct dispersing process comprising the steps of adding dielectric fine particles to a half-liquid polyamidic acid varnish and then knead-dispersing the dielectric fine particles with a triple roll. However, mixing the dielectric fine particles with the polyamidic acid causes aggregation of the dielectric fine particles, therefore it is difficult to uniformly disperse the dielectric fine particles, because the affinity between the dielectric fine particle and the polyamidic acid is very bad. For the polyamidic acid solution to be very viscous also makes uniform dispersing difficult. Thus, there is proposed a process comprising the step of synthesizing a polyamidic acid in a dielectric fine particle dispersion, that is, a process comprising the steps of: dispersing dielectric fine particles into an organic polar solvent and then allowing a diamine compound to react with an acid anhydride compound in the resultant dispersion, thus preparing a polyamidic acid solution (JP-A-145378/1994). However, also in this process, the aggregation force between dielectric fine particles is so strong that the aggregation of the dielectric fine particles occurs.

The dielectric fine particles, as aggregated in the above way, have a particle diameter of not smaller than 10 μm, and are foreign bodies in a sense. Therefore, when molding into the shape of a film, the surface of the resultant film is so rough as to be lusterless, resulting in damaging the appearance of the film, and further, the aggregated dielectric fine particles have bad effects on mechanical properties such as tensile strength and on electric properties such as electric insulation.

Similarly, as to main processes for dispersing carbon black into a solution of a polyamidic acid, the following are well-known: (1) a process comprising the steps of adding carbon black to a polyamidic acid solution and then dispersing the carbon black into the polyamidic acid solution with a dispersing machine such as sand mill or ball mill; (2) a process comprising the steps of adding carbon black to a half-liquid polyamidic acid varnish and then knead-dispersing the carbon black with a triple roll; and (3) a process comprising the step of synthesizing a polyamidic acid in a carbon black dispersion. However, in any of these processes, mixing the carbon black with the polyamidic acid causes aggregation of the carbon black, therefore it is impossible to uniformly disperse the carbon black, because the compatibility between the carbon black and the polyamidic acid is very bad. As a result, the carbon black still remains aggregated in films or coated films of the resultant polyimide. Therefore, there occur problems, for example, of roughness and no gloss of surfaces of the films, and the difficulty of controlling the electric resistance.

SUMMARY OF THE INVENTION

A. OBJECT OF THE INVENTION

An object of the present invention is to provide: a polyamidic acid-containing and fine particles-dispersed composition in which the compatibility between polyimide and fine particle such as dielectric fine particle or carbon black is improved, with the result that the fine particles are uniformly dispersed in a polyamidic acid solution; a production process for such a composition; and a fine particles-dispersed composition which can be effectively utilized as a raw intermediate in this production process.

B. DISCLOSURE OF THE INVENTION

In order to solve the above problems, a polyamidic acid-containing and fine particles-dispersed composition according to the present invention comprises fine particles and a polar solvent solution, wherein the fine particles are dispersed in the polar solvent solution using an organic polymer as a dispersant, and wherein the fine particles are of at least one kind selected from the group consisting of dielectric fine particles, electrosemiconductive fine particles, and electroconductive fine particles, and this composition further comprises a polyamidic acid.

A process for producing the above polyamidic acid-containing and fine particles-dispersed composition according to the present invention comprises: 1) the steps of: dissolving an organic polymer into a polar solvent; adding fine particles to the resultant solution; dispersing the fine particles into this solution to prepare a fine particle dispersion; and mixing the resultant fine particle dispersion and a polyamidic acid solution; wherein the fine particles are of at least one kind selected from the group consisting of dielectric fine particles, electrosemiconductive fine particles, and electroconductive fine particles; or 2) the step of polymerizing a tetracarboxylic dianhydride along with a diamine and/or diisocyanate as raw materials in the fine particle dispersion to prepare a polyamidic acid.

A fine particles-dispersed composition, which can be effectively utilized as a raw intermediate for producing the above polyamidic acid-containing and fine particles-dispersed composition according to the present invention, comprises fine particles and a polar solvent solution, wherein the fine particles are dispersed in the polar solvent solution using an organic polymer as a dispersant, and wherein the fine particles are of at least one kind selected from the group consisting of dielectric fine particles, electrosemiconductive fine particles, and electroconductive fine particles.

These and other objects and the advantages of the present invention will be more fully apparent from the following detailed disclosure.

DETAILED DESCRIPTION OF THE INVENTION

A preferable process for producing the above polyamidic acid-containing and fine particles-dispersed composition according to the present invention comprises the steps of: first preparing the present invention fine particles-dispersed composition, which is explained in detail below, as an intermediate using the below-mentioned raw materials; and then preparing a composition containing a polyamidic acid by the below-mentioned procedure using this intermediate as a raw material. However, how to produce the polyamidic acid-containing and fine particles-dispersed composition according to the present invention is not limited to this process involving the use of the raw intermediate. In short, it is enough to uniformly disperse the fine particles using the following organic polymer as a dispersant.

[Raw Materials Used for the Present Invention]

Organic Polymer as Dispersant

In the present invention, an organic polymer is used as a dispersant in order to improve the affinity between the fine particle and the polyamidic acid. The organic polymer exhibits very excellent effects as a dispersant for dispersing the fine particles into a polyamidic acid solution. If the organic polymer has a functional group reactable with the fine particles and if the fine particles are allowed to react with the organic polymer, then the fine particles are converted into polymer-grafted fine particles modified with the organic polymer. Such polymer-grafted fine particles are very excellent in the dispersibility in the polyamidic acid solution, therefore the mechanical and electric properties of the polyimide resin can be prevented from deteriorating, when compared with the case where the organic polymer is contained in the form of a dispersant independent of fine particles.

The organic polymer used in the present invention (hereinafter, unless otherwise noted, the term "organic polymer" includes "organic polymer having a functional group reactable with fine particles") is preferably a polymer having an amino group and/or an amide group, particularly, a polymer having an amide group.

Preferable examples of the polymer having an amino group include polymers having structural units such as aminoalkyl(meth)acrylates, aminoalkyl(meth)acrylamides, aminoalkyl vinyl ethers, vinylpyridines, vinylimidazoles and vinyl piperidines. Particularly, polymers having structural units such as aminoalkyl(meth)acrylates containing a tertiary amino group are preferable.

Preferable examples of the polymer having an amide group include polymers having structural units such as (meth)acrylamides, alkyl(meth)acrylamides and N-vinylamides. Particularly, polymers having structural units such as N-vinylamides are preferable.

The N-vinylamide structural unit is shown by formula (i) below:

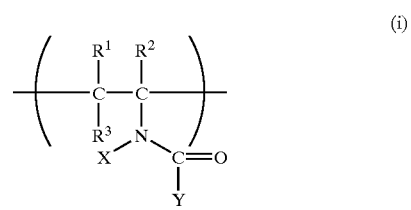

wherein: each of $R^1$, $R^2$ and $R^3$ is independently a hydrogen atom or an alkyl group; and each of X and Y is independently a hydrogen atom or an organic residue, with the proviso that X and Y may be bonded to each other to form a nitrogen-heterocyclic structure.

Preferable examples of the alkyl group, exemplifying $R^1$, $R^2$, and $R^3$, include alkyl groups with 1 to 4 carbon atoms such as methyl, ethyl, n-propyl, isopropyl, n-butyl, isobutyl, and tert-butyl. The above alkyl group may have a substituent such as a halogen group, a hydroxyl group, an ester group, a carboxylic acid group, or a sulfonic acid group, if necessary.

Examples of the organic residue, exemplifying X and Y, include methyl, ethyl, and phenyl. The above organic residue may have a substituent such as a halogen group, a hydroxyl group, an ester group, a carboxylic acid group, or a sulfonic acid group, if necessary. Examples of such an N-vinylamide structural unit include structural units derived from monomers such as N-vinylformamide, N-vinylacetamide, N-vinylphthalamide, N-vinylsuccinamide, and N-vinylurea.

Examples of N-vinylamide structural units in which X and Y are bonded to each other to form a nitrogen-heterocyclic structure include structural units derived from monomers such as N-vinylpyrrolidone, N-vinylpiperidone, N-vinylcaprolactam, and N-vinyloxazolidone.

Structural units derived from monomers such as N-vinylformamide, N-vinylacetamide, N-vinylpyrrolidone, N-vinylcaprolactam, and N-vinyloxazolidone are preferable among the above N-vinylamide structural units in respect to easy availability of raw materials and to good copolymerizability. Furthermore, the N-vinylpyrrolidone structural unit is particularly preferable considering the compatibility with the fine particles and with the polyamidic acid.

The organic polymer may contain two or more kinds of the above structural units having an amino group and/or an amide group.

The ratio of the structural unit having an amino group and/or an amide group in all structural units of the organic polymer is preferably not lower than 50 mol %, more preferably not lower than 70 mol %.

When the fine particles is modified with the organic polymer to prepare the polymer-grafted fine particles, the organic polymer includes a structural unit having a functional group reactable with the fine particles. The functional group reactable with the fine particles is not especially limited if it is to react with a functional group existing on a surface of the fine particles, and a variety of functional groups can be utilized.

Especially when the fine particles have a hydroxyl group as the surface functional group (e.g. dielectric fine particles), preferable examples thereof include an alkoxysilyl group, an epoxy group, a thioepoxy group, a carboxyl group, a hydroxyl group, an oxazoline group, and an aziridine group, because their addition reactions occur in a high yield by heating. Among them, the alkoxysilyl group, the epoxy group, and the thioepoxy group are more preferable, and the alkoxysilyl group is particularly preferable.

Examples of structural units having the alkoxysilyl group include those of formula (ii) below:

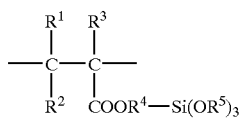
(ii)

wherein: $R^1$~$R^3$ are a hydrogen atom or methyl group;
$R^4$ is a divalent organic group with 1~20 carbon atoms which may have a substituent; and
$R^5$ is at least one monovalent group selected from the group consisting of a hydrogen atom, alkyl groups having 1~5 carbon atoms, and acyl groups having 2~5 carbon atoms; and formula (iii) below:

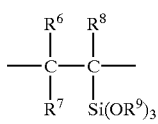
(iii)

wherein: $R^6$~$R^8$ are a hydrogen atom or methyl group; and
$R^9$ is at least one monovalent group selected from the group consisting of alkyl groups having 1~5 carbon atoms and acyl groups having 2~5 carbon atoms; and formula (iv) below:

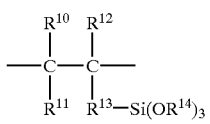
(iv)

wherein: $R^{10}$~$R^{12}$ are a hydrogen atom or methyl group;
$R^{13}$ is a divalent organic group with 1~20 carbon atoms which may have a substituent; and
$R^{14}$ is at least one monovalent group selected from the group consisting of a hydrogen atom, alkyl groups having 1~5 carbon atoms, and acyl groups having 2~5 carbon atoms.

Examples of structural units having the epoxy group include various structural units derived from epoxy group-containing polymerizable monomers, such as units having structures of the following formulae:

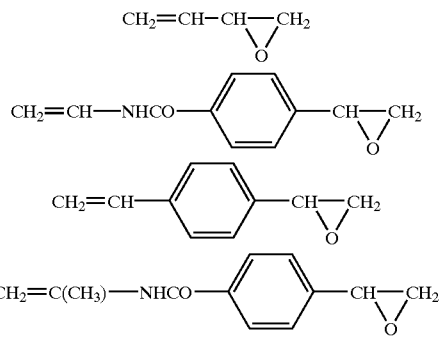

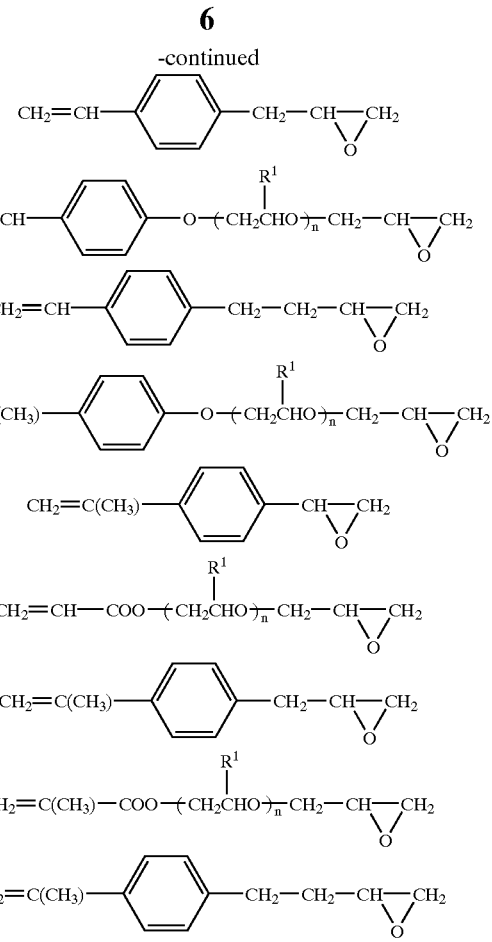

wherein: $R^1$ is a hydrogen atom or methyl group; and
n is 0 or an integer of 1~20.

Examples of structural units having the thioepoxy group include various structural units derived from thioepoxy group-containing polymerizable monomers, such as units having structures of the following formulae:

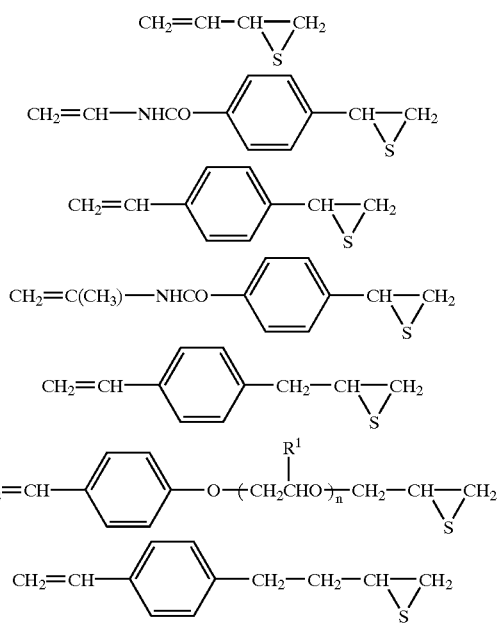

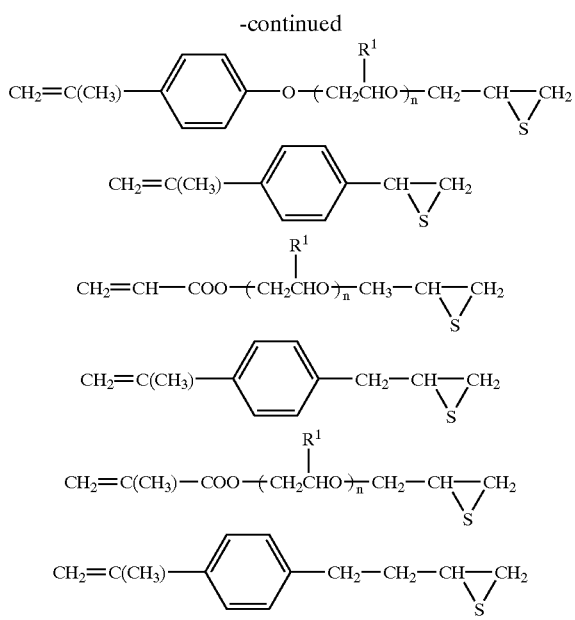

wherein $R^1$ and n are the same as the cases of the epoxy group-containing polymerizable monomers.

In addition, when the fine particles have a carboxyl group as the surface functional group (e.g. carbon black), preferable examples thereof include a carbonate group, an epoxy group, a thioepoxy group, an aziridine group, an oxazoline group and an N-hydroxyalkylamide group, because their addition reactions occur in a high yield by heating. When a polymer having the N-vinylamide structural unit is used as the organic polymer, the carbonate group is preferable among the above functional groups in respect to high copolymerizability with the N-vinylamides, and a cyclocarbonate group is particularly preferable.

Examples of structural units having the cyclocarbonate group include those of formula (ii) below:

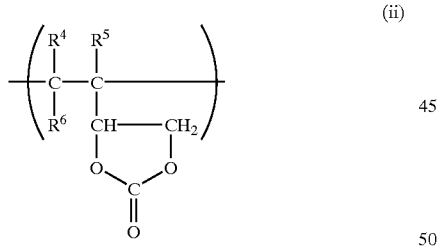

(ii)

wherein each of $R^4$, $R^5$ and $R^6$ is independently a hydrogen atom or an alkyl group.

Preferable examples of the alkyl group, exemplifying $R^4$, $R^5$, and $R^6$, include alkyl groups with 1 to 4 carbon atoms such as methyl, ethyl, n-propyl, isopropyl, n-butyl, isobutyl, and tert-butyl. The above alkyl group may have a substituent such as a halogen group, a hydroxyl group, an ester group, a carboxylic acid group, or a sulfonic acid group, if necessary.

Examples of the structural unit having the cyclocarbonate group include structural units derived from monomers such as vinylethylene carbonate, 2-methyl-vinylethylene carbonate and 3-methyl-vinylethylene carbonate. Among these, a structural unit derived from vinylethylene carbonate is preferable in respect to easy availability of raw materials and to good copolymerizability.

Examples of structural units having the epoxy group and examples of structural units having the thioepoxy group include the previously exemplified ones.

Examples of structural units having the aziridine group include structural units derived from aziridine group-containing polymerizable monomers, for example, of the following formulae:

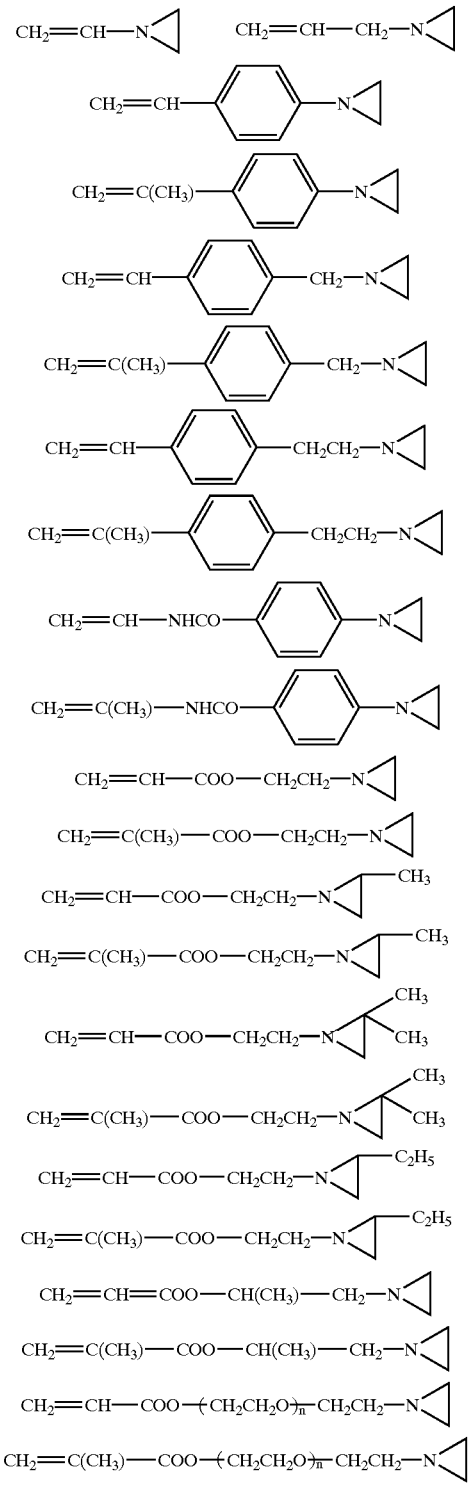

-continued

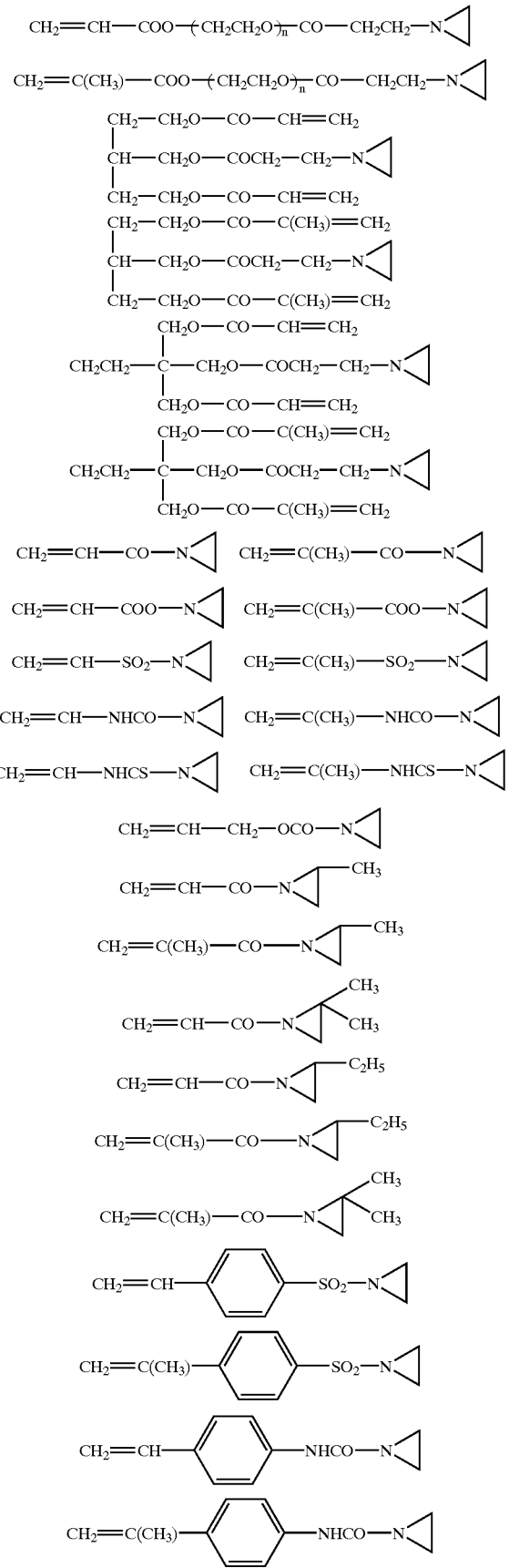
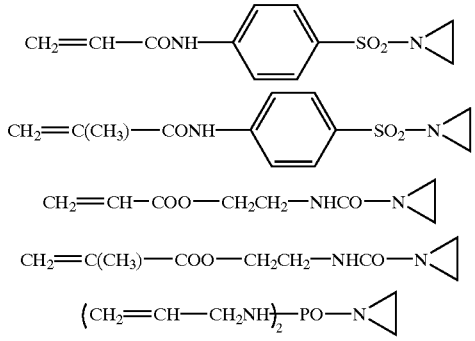

Examples of structural units having the oxazoline group include structural units derived from oxazoline group-containing polymerizable monomers such as 2-vinyl-2-oxazoline, 2-vinyl-4-methyl-2-oxazoline, 2-vinyl-5-methyl-2-oxazoline, 2-vinyl-4-ethyl-2-oxazoline, 2-vinyl-5-ethyl-2-oxazoline, 2-isopropenyl-2-oxazoline, 2-isopropenyl-4-methyl-2-oxazoline, 2-isopropenyl-5-methyl-2-oxazoline, 2-isopropenyl-4-ethyl-2-oxazoline, 2-isopropenyl-5-ethyl-2-oxazoline, and 2-isopropenyl-4,5-dimethyl-2-oxazoline.

Examples of structural units having the N-hydroxyalkylamide group include structural units derived from N-hydroxyalkylamide group-containing polymerizable monomers such as N-hydroxymethylacrylamide, N-hydroxyethylacrylamide, N-hydroxybutylacrylamide, N-hydroxyisobutylacrylamide, N-hydroxy-2-ethylhexylacrylamide, N-hydroxycyclohexylacrylamide, N-hydroxymethylmethacrylamide, N-hydroxyethylmethacrylamide, N-hydroxybutylmethacrylamide, N-hydroxyisobutylmethacrylamide, N-hydroxy-2-ethylhexylmethacrylamide, and N-hydroxycyclohexylmethacrylamide.

The organic polymer may contain two or more kinds of the above structural units having a functional group reactable with fine particles.

When the organic polymer contains the structural unit having a functional group reactable with fine particles, the ratio of this structural unit in all structural units of the organic polymer is preferably not lower than 0.1 mol %, more preferably not lower than 1 mol %.

The organic polymer used in the present invention may further contain structural units other than the above. Examples thereof include structural units derived from monomers such as: unsaturated carboxylic acids (e.g. acrylic acid, methacrylic acid, maleic acid, fumaric acid and itaconic acid) and esters or salts thereof; unsaturated carboxylamides (e.g. acrylamide and methacrylamide); unsaturated carboxylic anhydrides (e.g. maleic anhydride and itaconic anhydride); vinyl esters (e.g. vinyl acetate); vinyl ethers (e.g. methyl vinyl ether, ethyl vinyl ether, propyl vinyl ether and butyl vinyl ether); olefins (e.g. ethylene and propylene); halogenated olefins (e.g. vinyl chloride); and unsaturated epoxy compounds (e.g. glycidyl acrylate, glycidyl methacrylate, and allyl glycidyl ether).

The ratio of the above other structural units in all structural units of the organic polymer is preferably not higher than 30 mol %, more preferably not higher than 10 mol %.

The weight-average molecular weight of the organic polymer used in the present invention is preferably in the range of 5,000~2,000,000, more preferably 10,000~1,500,000. In the case where the weight-average molecular weight is lower than the above ranges, the stability of the dispersed fine particles in the polyamidic acid solution is difficult to sufficiently obtain. In the case where the weight-average molecular weight is higher than the above ranges, the viscosity of the fine particle dispersion is so high that it is inconvenient to handle the dispersion.

The process for producing the organic polymer used in the present invention is not especially limited, and monomer components to form the above structural units may be polymerized by conventional methods.

As to the polymerization method, any of bulk polymerization, solution polymerization, suspension polymerization, and emulsion polymerization can preferably be used.

The solvent for the polymerization reaction is not especially limited, but, for example, sole solvents or mixed solvents selected from the following solvent groups (1)~(15) can be used:

(1) aliphatic hydrocarbons such as hexane and octane;
(2) alicyclic saturated hydrocarbons such as cyclohexane;
(3) alicyclic unsaturated hydrocarbons such as cyclohexene;
(4) aromatic hydrocarbons such as benzene, toluene, and xylene;
(5) ketones such as acetone and methyl ethyl ketone;
(6) esters such as methyl acetate, ethyl acetate, butyl acetate, and γ-butyrolactone;
(7) halogenated hydrocarbons such as dichloroethane, chloroform, and carbon tetrachloride;
(8) ethers such as diethyl ether, dioxane, and dioxolane;
(9) alkylene glycol ethers such as propylene glycol monomethyl ether acetate and diethylene glycol monomethyl ether acetate;
(10) alcohols such as methyl alcohol, ethyl alcohol, butyl alcohol, isopropyl alcohol, ethylene glycol, propylene glycol monomethyl ether;
(11) amides such as dimethylformamide and N-methylpyrrolidone;
(12) sulfonic acid esters such as dimethyl sulfoxide;
(13) carbonate esters such as dimethyl carbonate and diethyl carbonate;
(14) alicyclic carbonate esters such as ethylene carbonate and propylene carbonate; and
(15) water.

In view of easiness of purification or recovery of the resultant polymer, among the above solvents, those which are selected from solvent groups (4)~(6) and (8)~(15) above are preferable, and those which are selected from polar solvent groups (5), (6), and (9)~(15) above are more preferable, and those which are selected from solvent groups (5), (6), (9), (10), (11), (14), and (15) above are still more preferable, and those which are selected from the group consisting of (10) alcohols and (15) water above are particularly preferable. However, when an alkoxysilyl group-containing polymerizable monomer is used, a water-free solvent is used in order to prevent hydrolysis-condensation of the alkoxysilyl group in the polymerization step.

Polar Solvent

Preferable examples of the polar solvent used for the present invention include aprotic polar solvents, which are used as solvents for polyamidic acids, such as N-methyl-2-pyrrolidone, dimethylformamide and dimethyl sulfoxide.

Fine Particles

The fine particles, used in the present invention, are of at least one kind selected from the group consisting of dielectric fine particles, electrosemiconductive fine particles, and electroconductive fine particles.

Examples of the dielectric fine particles include silica, alumina, zirconia, titania, magnesium oxide, magnesium carbonate, calcium carbonate, calcium sulfate, barium sulfate and aluminum oxide. Silica, alumina, zirconia and titania are preferable, and silica is particularly preferable. Any form of silica, such as spherical fused silica and pulverized silica, is usable.

Examples of the electrosemiconductive fine particles include: iron nitride; chromium oxide; zinc oxide; and fine particles of composite oxides such as titanium black, titanium yellow, and cobalt blue.

Examples of the electroconductive fine particles include: fine carbon particles such as carbon black and graphite; fine metal particles such as gold, silver, copper, platinum, aluminum, titanium, vanadium, chromium, manganese, iron, cobalt, nickel, zinc, tungsten, germanium, and palladium; fine metal oxide particles such as iron oxide, ruthenium oxide, and molybdenum oxide; and pigments such as phthalocyanine blue and phthalocyanine green.

The present invention is effective also for dispersing various fine particles obtained by treating the surfaces of materials such as organic pigments, inorganic pigments, carbon black, and metal particles with, for example, silica, alumina, zirconia and titania.

[Fine Particles-dispersed Composition]

The fine particles-dispersed composition according to the present invention is a fine particle dispersion in which the above fine particles are uniformly dispersed in the above polar solvent using the above organic polymer (including a fine particle-grafted polymer dispersion in which the above polymer-grafted fine particles (which are obtained by grafting the above organic polymer onto the above fine particles) are uniformly dispersed in the above polar solvent). Even if an attempt is made to dissolve the organic polymer into a polyamidic acid solution and to then disperse the fine particles into the resultant solution, aggregation of the fine particles merely occurs. The fine particles aggregate upon direct contact with a polyamidic acid, but this aggregation can be prevented by beforehand preparing the fine particle dispersion by use of the organic polymer.

Both in the case where the organic polymer is used alone as a dispersant and in the case where the polymer-grafted fine particles are prepared by modifying the fine particles with the organic polymer, a preferable process for producing the fine particle dispersion comprises the steps of: dissolving the organic polymer into a polar solvent; adding the fine particles to the resultant solution; and dispersing the fine particles into this solution to prepare the fine particle dispersion.

Both in the above processes, it is preferable that the step of dispersing the fine particles is carried out in a heated state. The temperature in dispersing the fine particles is preferably in the range of from room temperature to the boiling point of the solvent, more preferably 40~200° C. When the organic polymer has a functional group reactable with the fine particles, the reaction between the fine particle and this functional group is run by this heating to form the polymer-grafted fine particles, with the result that the re-aggregation of the fine particles can be prevented to inhibit the viscosity from changing with the passage of time, and that the preservation stability of the resultant fine particle dispersion is therefore improved. In addition, even when the organic polymer has no functional group reactable with the fine particles, the re-aggregation of the fine particles can be prevented, although the mechanism therefor is not clear. The present inventors found that, especially, when carbon black is used as the fine particles, even if the organic polymer has no functional group reactable with the carbon black, the same effect as the above is obtained wherein the effect is that the re-aggregation of the carbon black can be prevented to inhibit the viscosity from changing with the passage of time, and that the preservation stability of the resultant carbon black dispersion is therefore improved, although the mechanism therefor is not clear.

When the organic polymer is used alone as a dispersant, the composition of the fine particle dispersion is preferably as follows: the fine particle content in the dispersion is in the range of 1~50 weight %, more preferably 5~30 weight %, and the organic polymer content in the dispersion is in the range of 0.1~30 weight %, more preferably 1~20 weight %.

When the fine particles are modified with the organic polymer to prepare the polymer-grafted fine particles, the amount of the organic polymer as used is preferably in the range of 1~20 weight %, more preferably 5~100 weight %, of the fine particles, and the fine particle content in the dispersion is preferably in the range of 1~50 weight %, more preferably 5~30 weight %.

[Production Process for Polyamidic Acid-containing and Fine Particles-dispersed Composition]

Production Process

The polyamidic acid-containing and fine particles-dispersed composition according to the present invention is preferably produced from the above-obtained fine particle dispersion (intermediate) by either of the following processes. However, the below-mentioned production process according to the present invention does not necessarily include the steps for producing the above fine particle dispersion (intermediate), but may include the step of mixing a polyamidic acid with the separately prepared fine particle dispersion, wherein the polyamidic acid-mixing step may be carried out either by mixing a beforehand prepared polyamidic acid or by mixing a polyamidic acid while producing it.

(1) A process including the step of mixing the fine particle dispersion and the below-mentioned polyamidic acid solution.

(2) A process including the step of polymerizing a tetracarboxylic dianhydride along with a diamine and/or diisocyanate as raw materials in the fine particle dispersion by the below-mentioned procedure to prepare a polyamidic acid.

The polyamidic acid content in the polyamidic acid-containing and fine particles-dispersed composition according to the present invention is preferably in the range of 1~50 weight %, more preferably 5~30 weight %. The fine particle content is preferably in the range of 0.1~500 weight %, more preferably 1~200 weight %, of the polyamidic acid. It is preferable that the concentration and amount of each component as used is determined such that the composition in the finally resulting fine particles-dispersed polyamidic acid composition can fall into the aforementioned ranges in processes (1) and (2) above.

Incidentally, as the need arises, the polyamidic acid-containing and fine particles-dispersed composition according to the present invention can further comprise conventional additives, such as organosilanes, pigments, fillers, antifriction agents, dielectrics, and lubricants, besides the above fine particles within the range not damaging the effects of the present invention.

Polyamidic Acid

The polyamidic acid is a polymer comprising a major proportion of structural unit of general formula (1) below, and can be converted into a polymer (polyimide or polyamideimide) having an imide ring or other cyclic structure by heating or with a fit catalyst.

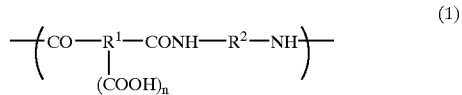

$R^1$ in general formula (1) above is a trivalent or tetravalent organic group having at least two carbon atoms. In view of the heat resistance, it is preferable that $R^1$ contains a cyclic hydrocarbon, aromatic ring or aromatic heterocycle and is a trivalent or tetravalent group having 6~30 carbon atoms. Examples of $R^1$ include a phenyl group, a biphenyl group, a terphenyl group, a naphthalene group, a perylene group, a diphenyl ether group, a diphenylsulfone group, a diphenylpropane group, a benzophenone group, a biphenyltrifluoropropane group, a cyclobutyl group and a cyclopentyl group, but there is no limitation thereto.

$R^2$ in general formula (1) above is a divalent organic group having at least two carbon atoms. In view of the heat resistance, it is preferable that $R^2$ contains a cyclic hydrocarbon, aromatic ring or aromatic heterocycle and is a divalent group having 6~30 carbon atoms. Examples of $R^2$ include a phenyl group, a biphenyl group, a terphenyl group, a naphthalene group, a perylene group, a diphenyl ether group, a diphenylsulfone group, a diphenylpropane group, a benzophenone group, a biphenyltrifluoropropane group, a diphenylmethane group and a dicydohexylmethane group, but there is no limitation thereto.

The polyamidic acid, which is a polymer comprising a major proportion of structural unit of general formula (1), may comprise one kind each of $R^1$ and $R^2$, or may be a copolymer comprising at least two kinds each of $R^1$ and $R^2$. Furthermore, the polyamidic acid may be a product by a process including the step of copolymerizing a diamine component such as bis(3-aminopropyl)tetramethyldisiloxane having a siloxane structure. In addition, the polyamidic acid may be a product by a process including the steps of, after the polymerization to prepare the polyamidic acid, adding thereto an acid anhydride, such as maleic anhydride, as a blocking agent for a terminal amino group in accordance with the concentration of the terminal group, and then allowing them to react with each other.

The symbol "n" in general formula (1) above is 1 or 2.

Examples of the polyamidic acid used in the present invention, as to polyamidic acids (n=2) to form polyimides by heating, include those which are synthesized from the following combinations: pyromellitic dianhydride and 4,4'-diaminodiphenyl ether; 3,3',4,4'-benzophenonetetracarboxylic dianhydride and 4,4'-diaminodiphenyl ether; 3,3',4,4'-biphenyltetracarboxylic dianhydride and 4,4'-diaminodiphenyl ether; 3,3',4,4'-biphenyltrifluoropropanetetracarboxylic dianhydride and 4,4'-diaminodiphenyl ether; 3,3',4,4'-biphenylsulfonetetracarboxylic dianhydride and 4,4'-diaminodiphenyl ether; pyromellitic dianhydride and 3,3'(or 4,4')-diaminodiphenylsulfone; 3,3',4,4'-benzophenonetetracarboxylic dianhydride and 3,3'(or 4,4')-diaminodiphenylsulfone; 3,3',4,4'-biphenyltetracarboxylic dianhydride and 3,3'(or 4,4')-diaminodiphenylsulfone; pyromellitic dianhydride and 4,4'-diaminodiphenyl sulfide; 3,3',4,4'-benzophenonetetracarboxylic dianhydride and 4,4'-diaminodiphenyl sulfide; 3,3',4,4'-biphenyltetracarboxylic dianhydride and 4,4'-diaminodiphenyl sulfide; 3,3',4,4'-benzophenonetetracarboxylic dianhydride and paraphenylenediamine; 3,3',4,4'-biphenyltetracarboxylic dianhydride and paraphenylenediamine; 3,3',4,4'-diphenyl ether tetracarboxylic dianhydride and paraphenylenediamine; 3,3',4,4'-biphenyltrifluoropropanetetracarboxylic dianhydride and paraphenylenediamine; 2,3,5-tricarboxycyclopentylacetic dianhydride and 4,4'-diaminodiphenyl ether; 3,3',4,4'-biphenyltetracarboxylic dianhydride, 3,3',4,4'-benzophenonetetracarboxylic dianhydride, and 4,4'-diaminodicyclohexylmethane; pyromellitic dianhydride, 3,3',4,4'-benzophenonetetracarboxylic dianhydride, and 3,3'(or 4,4')-diaminodiphenyl ether; pyromellitic dianhydride, 3,3',4,4'-biphenyltetracarboxylic dianhydride, and paraphenylenediamine; 3,3',4,4-benzophenonetetracarboxylic dianhydride and 4,4'-diaminodiphenyl ether, and bis(3-aminopropyl) tetramethyldisiloxane; pyromellitic dianhydride, 4,4'-diaminodiphenyl ether, and bis(3-aminopropyl) tetramethyldisiloxane; 3,3',4,4'-biphenyltetracarboxylic dianhydride, 4,4'-diaminodiphenylmethane, 3,3'(or 4,4')-diaminodiphenylsulfone, and bis(3-aminopropyl) tetramethyldisiloxane. However, there is no limitation thereto. These polyamidic acids are synthesized by conventional processes, namely, comprising the steps of: selectively combining tetracarboxylic anhydrides and diamines, and allowing them to react with each other in solvents.

Folyamidic acids (n=1) to form polyamideimides by heating can be obtained from the following combinations: tricarboxylic acid derivatives, having structures similar to those of the aforementioned monomers, and diamines; tetracarboxylic dianhydrides, dicarboxylic acid derivatives (e.g. terephthaloyl chloride), and diamines; or trimellitic dianhydride and diisocyanates (e.g. diphenylmethane diisocyanate). Synthesis of the polyamidic acids to form polyamideimides by heating is not limited to the above, but any of the above syntheses can effectively be used in the present invention.

[Uses of Polyamidic Acid-containing and Fine Particles-dispersed Composition]

The polyamidic acid-containing and fine particles-dispersed composition according to the present invention can be subjected to imidation by heating or with a fit catalyst to form a polymer (polyimide or polyamideimide) having an imide ring or other cyclic structure. The imidation is usually carried out by heating, and the heating temperature is preferably in the range of 180~400° C., more preferably 180~350° C.

Examples of uses of the polyamidic acid-containing and fine particles-dispersed composition according to the present invention include the following:

electroconductive uses such as: antistatic coatings for inner members of copying machines or printers; electric charge retainers; toner-transferring members; anchoring belts; intermediate transferring belts; film type resistors; electroconductive pastes; cell electrode materials; antistatic resins; electroconductive adhesive layers for condensers; electroconductive shaking members; base materials for circuit substrates; heat-resistant electrosemiconductive materials; temperature-selfcontrolling electroheating elements; heating resistors for thermal heads; electroheating sheets for recording; coats for electric wire cables; sheet heating elements;

electromagnetic wave-absorbing uses such as: electromagnetic wave-shielding sheets; flexible wiring sheets; magnetic wave-absorbent sheets; heat wave-absorbent sheets; ultraviolet ray-absorbent sheets;

light-blocking-off uses such as: ultraviolet-ray-blocking-off materials; black matrices for color filters;

fluctuating uses such as: surface-treating agents for low-noise gears; molded structures for friction materials;

other uses such as: substrates for photoconvertors (e.g. substrates for solar cells, substrates for photosensors, substrates for photoswitches); substrates for electronic instruments (e.g. substrates for printed wiring, substrates for thermal heads); ink jet inks.

(Effects and Advantages of the Invention):

The present invention can give a dispersion having extremely stable dispersibility of fine particles, therefore the invention can provide a polyamidic acid-containing and fine particles-dispersed composition in which the affinity between the fine particle and the polyamidic acid solution can be improved, with the result that the fine particles are uniformly dispersed in the polyamidic acid solution. Therefore, not only does no aggregation of the fine particles occur in the polyamidic acid composition, but also the dispersed state of the fine particles remains unchanged and good even if polyimidation is carried out. Accordingly, no mechanical properties of polyimide films are damaged, and the surface state of the polyimide films is smooth and good. In addition, when carbon black is used as the fine particles, the electric resistance can easily be controlled by changing the amount (concentration) of the carbon black.

DETAILED DESCRIPTION OF THE PREFERRED EMBODIMENTS

Hereinafter, the present invention is more specifically illustrated by the following examples of some preferred embodiments in comparison with comparative examples not according to the invention. However, the present invention is not limited thereto.

<Examples of Use of Dielectric Fine Particles as Fine Particles>

Hereinafter, silica of dielectric fine particles was used as the fine particles, therefore the fine particles-dispersed composition which is an intermediate to produce the polyamidic acid-containing and fine particles-dispersed composition is referred to as "silica particle dispersion". Evaluations of the respective dispersed states in the silica particle dispersion and in the polyamidic acid-containing and fine particles-dispersed composition as produced therefrom were performed in the following ways.

[Evaluation of Dispersed State in silica Particle Dispersion]

A silica particle dispersion is diluted to 100 times with N-methyl-2-pyrrolidone to measure the particle diameter distribution of the silica particles with a dynamic light-scattering measurement apparatus (DLS700, made by Otsuka Denshi).

[Evaluation of Dispersed State in Silica Particles-dispersed Polyamide Membrane]

An amount of 10 parts by weight of silica particle dispersion is added to 10 parts by weight of the polyamidic acid varnish resultant from Synthetic Example 1-1 below, and the resultant mixture is well stirred until becoming uniform, thus obtaining a silica particle-containing polyamidic acid varnish. Next, 0.5 parts by weight of this polyamidic acid varnish is dropped onto a glass plate 50 mm square and 2 mm thick, and then the glass plate is rotated at a rate of 2,000 rpm with a spin coater (1H-D2, made by Mikasa Kabushiki Kaisha) for 1 minute to form a membrane on the glass plate. This membrane is left on a hot plate of 150° C. for 10 minutes, thereby evaporating the solvent. Next, the membrane is heated at 200° C. for 30 minutes and then at 350° C. for 30 minutes with an oven to run a polyimidation reaction, thus obtaining a polyimide membrane. The dispersed state of the silica particles in this polyimide membrane is observed with an optical microscope.

EXAMPLES AND COMPARATIVE EXAMPLES

The polyamidic acid varnish, used in the below-mentioned examples and comparative examples, was synthesized in the following way.

Synthetic Example 1-1—Synthesis of Polyamidic Acid Varnish

An amount of 21.81 parts by weight of pyromellitic dianhydride and 19.83 parts by weight of 4,4'-diaminodiphenylmethane were allowed to run a polycondensation reaction in 166.56 parts by weight of N-methyl-2-pyrrolidone at normal temperature for 3 hours, thus obtaining 208.20 parts by weight of polyamidic acid varnish having a solid content of 20 weight %.

Comparative Example 1-1

An amount of 135 parts by weight of N-methyl-2-pyrrolidone, 15 parts by weight of silica particles having an average particle diameter of 0.1 μm, and 800 parts by weight of zirconia-made beads were placed into a separable flask as equipped with a thermosensor, stirring vanes, and a condenser, and the resultant mixture was stirred at 700 rpm at room temperature for 5 hours. Thereafter, the liquid was separated from the zirconia-made beads by filtration, thus obtaining silica particle dispersion (1-A0).

The results of measuring the particle diameter distribution of the silica particles in this silica particle dispersion (1-A0) are shown in Table 1.

Next, 10 parts by weight of silica particle dispersion (1-A0) was added to 10 parts by weight of the polyamidic acid varnish resultant from Synthetic Example 1-1 above, and the resultant mixture was well stirred until becoming uniform, thus obtaining silica particle-containing polyamidic acid varnish (1-B0), from which polyimide membrane (1-D0) was obtained in accordance with the aforementioned procedure of the method for evaluating the dispersed state in the silica particles-dispersed polyamide membrane.

The dispersed state of the silica particles in this polyimide membrane (1-D0) is shown in Table 1.

Example 1-1

An amount of 6 parts by weight of poly(vinylpyrrolidone) K-90 (Wako Pure Chemical Industries, Ltd.) and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 15 parts by weight of silica particles having an average particle diameter of 0.1 μm and 800 parts by weight of zirconia-made beads were then added. The resultant mixture was stirred at 700 rpm at room temperature for 5 hours. Thereafter, the liquid was separated from the zirconia-made beads by filtration, thus obtaining silica particle dispersion (1-A1).

The results of measuring the particle diameter distribution of the silica particles in this silica particle dispersion (1-A1) are shown in Table 1.

Next, polyimide membrane (1-D1) was obtained from this silica particle dispersion (1-A1) and the polyamidic acid varnish of Synthetic Example 1-1 above in accordance with the aforementioned procedure of the method for evaluating the dispersed state in the silica particles-dispersed polyamide membrane.

The dispersed state of the silica particles in this polyimide membrane (1-D1) is shown in Table 1.

Example 1-2

At first, a modified polyvinylpyrrolidone was produced in the following way.

First of all, 10 parts by weight of vinyltriethoxysilane (hereinafter referred to as "VES"), 90 parts by weight of N-vinylpyrrolidone (hereinafter referred to as "VP"), and 100 parts by weight of ethanol were placed into a reaction vessel as equipped with a thermosensor, a reflux condenser, dropping funnels, a nitrogen-gas-introducing tube, and a stirrer. The internal air of the reaction vessel was then replaced with nitrogen. Next, while the mixture in the reaction vessel was stirred, the temperature was raised to 65° C., and 0.8 parts by weight of 2,2'-azobis(2-methylbutyronitrile) (as a polymerization initiator) and 15 parts by weight of ethanol were then added dropwise to the reaction vessel over a period of 3 hours. After 30 minutes from the end of the dropwise addition of them all, 0.2 parts by weight of 2,2'-azobis(2-methylbutyronitrile) and 5 parts by weight of ethanol were further dropwise added to the reaction vessel. Thereafter, the reaction vessel was heated to 75° C. to carry out a reaction for 2 hours, and then the reaction vessel was cooled to room temperature, thus obtaining an ethanol solution of a copolymer of VES and VP (hereinafter referred to as "P(VES-VP)"). This ethanol solution of P(VES-VP) was dried under vacuum to obtain solid modified polyvinylpyrrolidone (1-RP1), of which the weight-average molecular weight was about 100,000.

Next, a polymer-grafted silica particle dispersion was produced from the resultant modified polyvinylpyrrolidone (1-RP1) in the following way.

An amount of 6 parts by weight of modified polymer as obtained above, namely, modified polyvinylpyrrolidone (1-RP1), and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 15 parts by weight of silica particles, having an average particle diameter of 0.1 μm, and 800 parts by weight of zirconia-made beads were then added. The resultant mixture was stirred at 700 rpm at 100° C. for 5 hours. Thereafter, the liquid was separated from the zirconia-made beads by filtration, thus obtaining polymer-grafted silica particle dispersion (1-A2).

The results of measuring the particle diameter distribution of the silica particles in this polymer-grafted silica particle dispersion (1-A2) are shown in Table 1.

Finally, polyimide membrane (1-D2) was obtained from this polymer-grafted silica particle dispersion (1-A2) and the polyamidic acid varnish of Synthetic Example 1-1 above in accordance with the aforementioned procedure of the method for evaluating the dispersed state in the silica particles-dispersed polyamide membrane.

The dispersed state of the silica particles in this polyimide membrane (1-D2) is shown in Table 1.

Example 1-3

At first, a modified acrylic polymer was produced in the following way.

First of all, 10 parts by weight of styrene (hereinafter referred to as "Sty"), 35 parts by weight of methyl methacrylate (hereinafter referred to as "MMA"), 5 parts by weight of isopropenyloxazoline (hereinafter referred to as "IPO"), and 400 parts by weight of ethyl acetate were placed into a reaction vessel as equipped with a thermosensor, a reflux condenser, dropping funnels, a nitrogen-gas-introducing tube, and a stirrer. The internal air of the reaction vessel was then replaced with nitrogen. Next, while the mixture in the reaction vessel was stirred, the temperature was raised to 70° C. Thereafter, 0.25 parts by weight of 2,2'-azobisisobutyronitrile (as a polymerization initiator) and 50 parts by weight of ethyl acetate were added dropwise to the reaction vessel over a period of 3 hours. After the end of the dropwise addition of them all, the copolymerization reaction was carried out at 70° C. for another 2 hours, and then the reaction vessel was cooled to room temperature, thus obtaining a solution of a copolymer of Sty, MMA and IPO (hereinafter referred to as "P(Sty-MMA-IPO)"). This solution of P(Sty-MMA-IPO) was dried under vacuum to obtain solid (1-RP2), of which the weight-average molecular weight was about 80,000.

Next, a polymer-grafted silica particle dispersion was produced from the resultant acrylic polymer (1-RP2) in the following way.

An amount of 6 parts by weight of modified polymer (1-RP2), as obtained above, and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 15 parts by weight of silica particles, having an average particle diameter of 0.1 μm, and 800 parts by weight of zirconia-made beads were then added. The resultant mixture was stirred at 700 rpm at 100° C. for 5 hours. Thereafter, the liquid was separated from the zirconia-made beads by filtration, thus obtaining polymer-grafted silica particle dispersion (1-A3).

The results of measuring the particle diameter distribution of the silica particles in this polymer-grafted silica particle dispersion (1-A3) are shown in Table 1.

Next, polyimide membrane (1-D3) was obtained from this polymer-grafted silica particle dispersion (1-A3) and the polyamidic acid varnish of Synthetic Example 1-1 above in accordance with the aforementioned procedure of the method for evaluating the dispersed state in the silica particles-dispersed polyamide membrane.

The dispersed state of the silica particles in this polyimide membrane (1-D3) is shown in Table 1.

TABLE 1

|  | Average particle diameter | Dispersed state of silica particles in polyimide membrane |
|---|---|---|
| Comparative Example 1-1 | 10 μm | X |
| Example 1-1 | 0.1 μm | ○ |
| Example 1-2 | 0.1 μm | ◎ |
| Example 1-3 | 0.1 μm | Δ |

X: Aggregated.
Δ: Slightly aggregated.
○: Hardly aggregated.
◎: Not aggregated at all.

<Examples of Use of Carbon Black as Fine Particles>

Hereinafter, carbon black of electroconductive fine particles was used as the fine particles, therefore the fine particles-dispersed composition to produce the polyamidic acid-containing and fine particles-dispersed composition is referred to as "carbon black dispersion".

Comparative Example 2-1
[Preparation of Carbon Black Dispersion]

An amount of 135 parts by weight of N-methyl-2-pyrrolidone, 15 parts by weight of carbon black MA100R (made by Mitsubishi Chemicals Corporation), and 800 parts by weight of zirconia-made beads were placed into a separable flask as equipped with a thermosensor, stirring vanes, and a condenser, and the resultant mixture was stirred at 700 rpm at room temperature for 5 hours. Thereafter, the liquid was separated from the zirconia-made beads by filtration, thus obtaining carbon black dispersion (2-A0).

[Evaluation of Carbon Black Dispersion]

After carbon black dispersion (2-A0) was diluted moderately with N-methyl-2-pyrrolidone, the dispersed state of the carbon black was observed with an optical microscope (of 400 magnifications). The results are shown in Table 6. In addition, the viscosity of carbon black dispersion (2-A0) was measured with a B-type viscometer immediately, 30 days, or 60 days after its preparation, thereby evaluating the variation of the viscosity with the passage of time. The results are shown in Table 2.

[Preparation and Evaluation of Carbon Black-dispersed Polyamidic Acid Composition]

Next, 2 parts by weight of carbon black dispersion (2-A0) was added to 10 parts by weight of the polyamidic acid varnish resultant from Synthetic Example 1-1, and the resultant mixture was well stirred until becoming uniform, thus obtaining carbon black-containing polyamidic acid varnish (2-B0). After this carbon black-containing polyamidic acid varnish (2-B0) was diluted moderately with N-methyl-2-pyrrolidone, the dispersed state of the carbon black was observed with an optical microscope (of 400 magnifications). The results are shown in Table 3. Incidentally, carbon black dispersion (2-A0) used was as was immediately, 30 days, or 60 days after its preparation.

[Preparation and Evaluation of Polyimide Membrane]

About 0.5 parts by weight of carbon black-containing polyamidic acid varnish (2-B0) was dropped onto a glass plate 50 mm square and 2 mm thick, and then the glass plate was rotated at 2,000 rpm with a spin coater (1H-D2, made by Mikasa Kabushiki Kaisha) for 1 minute to form membrane (2-C0) on the glass plate. Furthermore, membrane (2-C0) was left on a hot plate of 150° C. for 10 minutes, thereby evaporating the solvent. Next, membrane (2-C0) was heated at 200° C. for 30 minutes and then at 350° C. for 30 minutes with an oven to run a polyimidation reaction, thus obtaining polyimide membrane (2-D0).

The dispersed state of the carbon black in polyimide membrane (2-D0) was observed with an optical microscope (of 400 magnifications). The results are shown in Table 4.

In addition, whether the surface of the membrane was glossy or not was evaluated with the eye. The results are shown in Table 5.

Incidentally, carbon black dispersion (2-A0) used was as was immediately, 30 days, or 60 days after its preparation.

Example 2-1

An amount of 6 parts by weight of poly(vinylpyrrolidone) K-90 (Wako Pure Chemical Industries, Ltd.) and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 15 parts by weight of carbon black MA100R (made by Mitsubishi Chemicals Corporation) and 800 parts by weight of zirconia-made beads were then added. The resultant mixture was stirred at 700 rpm at room temperature for 5 hours. Thereafter, the liquid was separated from the zirconia-made beads by filtration, thus obtaining carbon black dispersion (2-A1).

The dispersed state of the carbon black in carbon black dispersion (2-A1) was observed in the same way as of Comparative Example 2-1. The results are shown in Table 6. In addition, the variation of the viscosity with the passage of time of carbon black dispersion (2-A1) was evaluated in the same way as of Comparative Example 2-1. The results are shown in Table 2.

Next, in the same way as of Comparative Example 2-1, carbon black-containing polyamidic acid varnish (2-B1) was produced from carbon black dispersion (2-A1) to observe the dispersed state of the carbon black in polyamidic acid varnish (2-B1). The results are shown in Table 3.

Next, in the same way as of Comparative Example 2-1, polyimide membrane (2-D1) was obtained from carbon black-containing polyamidic acid varnish (2-B1) to observe the dispersed state of the carbon black in polyimide membrane (2-D1). The results are shown in Table 4. In addition, whether the surface of the membrane was glossy or not was evaluated with the eye. The results are shown in Table 5.

Example 2-2

Carbon black dispersion (2-A2) was obtained in the same way as of Example 2-1 except that the temperature in dispersing was changed to 50° C.

The dispersed state of the carbon black in carbon black dispersion (2-A2) was observed in the same way as of Comparative Example 2-1. The results are shown in Table 6. In addition, the variation of the viscosity with the passage of time of carbon black dispersion (2-A2) was evaluated in the same way as of Comparative Example 2-1. The results are shown in Table 2.

Next, in the same way as of Comparative Example 2-1, carbon black-containing polyamidic acid varnish (2-B2) was produced from carbon black dispersion (2-A2) to observe the dispersed state of the carbon black in polyamidic acid varnish (2-B2). The results are shown in Table 3.

Next, in the same way as of Comparative Example 2-1, polyimide membrane (2-D2) was obtained from carbon black-containing polyamidic acid varnish (2-B2) to observe the dispersed state of the carbon black in polyimide membrane (2-D2). The results are shown in Table 4. In addition, whether the surface of the membrane was glossy or not was evaluated with the eye. The results are shown in Table 5.

Example 2-3

Carbon black dispersion (2-A3) was obtained in the same way as of Example 2-1 except that the temperature in dispersing was changed to 120° C.

The dispersed state of the carbon black in carbon black dispersion (2-A3) was observed in the same way as of Comparative Example 2-1. The results are shown in Table 6. In addition, the variation of the viscosity with the passage of time of carbon black dispersion (2-A3) was evaluated in the same way as of Comparative Example 2-1. The results are shown in Table 2.

Next, in the same way as of Comparative Example 2-1, carbon black-containing polyamidic acid varnish (2-B3) was produced from carbon black dispersion (2-A3) to observe the dispersed state of the carbon black in polyamidic acid varnish (2-B3). The results are shown in Table 3.

Next, in the same way as of Comparative Example 2-1, polyimide membrane (2-D3) was obtained from carbon black-containing polyamidic acid varnish (2-B3) to observe the dispersed state of the carbon black in polyimide membrane (2-D3). The results are shown in Table 4. In addition, whether the surface of the membrane was glossy or not was evaluated with the eye. The results are shown in Table 5.

Example 2-4

At first, a modified polyvinylpyrrolidone (2-RP1) was produced in the following way.

First of all, 2.8 parts by weight of vinylethylene carbonate (hereinafter referred to as "VEC"), 25.2 parts by weight of N-vinylpyrrolidone (hereinafter referred to as "VP"), 400 parts by weight of ion-exchanged water, and 0.14 parts by weight of tetrasodium pyrophosphate were placed into a reaction vessel as equipped with a thermosensor, a reflux condenser, dropping funnels, a nitrogen-gas-introducing tube, and a stirrer. The internal air of the reaction vessel was then replaced with nitrogen. Next, while the mixture in the reaction vessel was stirred, the temperature was raised to 65° C., and thereto 0.07 parts by weight of 2,2'-azobis (amidinopropane)dihydrochloride (as a polymerization initiator) and 1.0 part by weight of ion-exchanged water were then added to carry out a copolymerization reaction for 15 minutes. Thereafter, 11.2 parts by weight of VEC, 100.8 parts by weight of VP, 0.63 parts by weight of 2,2'-azobis (amidinopropane)dihydrochloride, and 9 parts by weight of ion-exchanged water were separately added dropwise to the reaction vessel over a period of 3 hours. After 30 minutes from the end of the dropwise addition of them all, 0.28 parts by weight of 2,2'-azobis(amidinopropane)dihydrochloride and 5 parts by weight of ion-exchanged water were further dropwise added to the reaction vessel. Thereafter, the reaction vessel was heated to 90° C. to carry out a copolymerization reaction for 30 minutes, and then the reaction vessel was cooled to room temperature, thus obtaining an aqueous solution of a copolymer of VEC and VP (hereinafter referred to as "P(VEC-VP)"). This aqueous solution of P(VEC-VP) was dried under vacuum to obtain solid (2-RP1), of which the weight-average molecular weight was 500,000.

An amount of 6 parts by weight of modified polymer (2-RP1), as obtained above, and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 0.06 parts by weight of n-tetrabutylammonium bromide (special grade of Wako Pure Chemical Industries, Ltd.), 15 parts by weight of carbon black MA100R (made by Mitsubishi Chemicals Corporation) and 800 parts by weight of zirconia-made beads were then added. The resultant mixture was stirred at 700 rpm at 120° C. for 5 hours. Thereafter, the liquid was separated from the zirconia-made beads by filtration, thus obtaining carbon black-grafted polymer liquid (2-GCB1).

The dispersed state of the carbon black in carbon black-grafted polymer liquid (2-GCB1) was observed in the same way as of Comparative Example 2-1. The results are shown in Table 6. In addition, the variation of the viscosity with the passage of time of carbon black-grafted polymer liquid (2-GCB1) was evaluated in the same way as of Comparative Example 2-1. The results are shown in Table 2.

Next, in the same way as of Comparative Example 2-1, carbon black-containing polyamidic acid varnish (2-B4) was produced from carbon black-grafted polymer liquid (2-GCB1) to observe the dispersed state of the carbon black in polyamidic acid varnish (2-B4). The results are shown in Table 3.

Next, in the same way as of Comparative Example 2-1, polyimide membrane (2-D4) was obtained from carbon black-containing polyamidic acid varnish (2-B4) to observe the dispersed state of the carbon black in polyimide membrane (2-D4). The results are shown in Table 4. In addition, whether the surface of the membrane was glossy or not was evaluated with the eye. The results are shown in Table 5.

Example 2-5

At first, a modified acrylic polymer (2-RP2) was produced in the following way.

First of all, 10 parts by weight of styrene (hereinafter referred to as "Sty"), 35 parts by weight of methyl methacrylate (hereinafter referred to as "MMA"), 5 parts by weight of isopropenyloxazoline (hereinafter referred to as "IPO"), and 400 parts by weight of ethyl acetate were placed into a reaction vessel as equipped with a thermosensor, a reflux condenser, dropping funnels, a nitrogen-gas-introducing tube, and a stirrer. The internal air of the reaction vessel was then replaced with nitrogen. Next, while the mixture in the reaction vessel was stirred, the temperature was raised to 70° C. Thereafter, 0.25 parts by weight of 2,2'-azobisisobutyronitrile (as a polymerization initiator) and 50 parts by weight of ethyl acetate were added dropwise to the reaction vessel over a period of 3 hours. After the end of the dropwise addition of them all, the copolymerization reaction was carried out at 70° C. for another 2 hours, and then the reaction vessel was cooled to room temperature, thus obtaining a solution of a copolymer of Sty, MMA and IPO (hereinafter referred to as "P(Sty-MMA-IPO)"). This solution of P(Sty-MMA-IPO) was dried under vacuum to obtain solid (2-RP2), of which the weight-average molecular weight was 80,000.

An amount of 6 parts by weight of modified polymer (2-RP2), as obtained above, and 129 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 15 parts by weight of carbon black MA100R (made by Mitsubishi Chemicals Corporation) and 800 parts by weight of zirconia-made beads were then added. The resultant mixture was stirred at 700 rpm at 120° C. for 5 hours. Thereafter, the liquid was separated from the zirconia-made beads by filtration, thus obtaining carbon black-grafted polymer liquid (2-GCB2).

The dispersed state of the carbon black in carbon black-grafted polymer liquid (2-GCB2) was observed in the same way as of Comparative Example 2-1. The results are shown in Table 6. In addition, the variation of the viscosity with the passage of time of carbon black-grafted polymer liquid (2-GCB2) was evaluated in the same way as of Comparative Example 2-1. The results are shown in Table 2.

Next, in the same way as of Comparative Example 2-1, carbon black-containing polyamidic acid varnish (2-B5) was produced from carbon black-grafted polymer liquid (2-GCB2) to observe the dispersed state of the carbon black in polyamidic acid varnish (2-B5). The results are shown in Table 3.

Next, in the same way as of Comparative Example 2-1, polyimide membrane (2-D5) was obtained from carbon black-containing polyamidic acid varnish (2-B5) to observe the dispersed state of the carbon black in polyimide membrane (2-D5). The results are shown in Table 4. In addition, whether the surface of the membrane was glossy or not was evaluated with the eye. The results are shown in Table 5.

TABLE 2

| | Preparation conditions | | Viscosity (cps) of carbon black dispersion | | |
|---|---|---|---|---|---|
| | Dispersant | Heating treatment | Immediately after preparation | After 30 days | After 60 days |
| Comparative Example 2-1 | None | None | 50 | Gel | Gel |
| Example 2-1 | PVP | None | 100 | 500 | Gel |
| Example 2-2 | PVP | 50° C. | 95 | 130 | 200 |
| Example 2-3 | PVP | 120° C. | 80 | 90 | 100 |
| Example 2-4 | Modified PVP | 120° C. | 55 | 56 | 60 |
| Example 2-5 | Modified acrylic | 120° C. | 90 | 100 | 140 |

TABLE 3

| | Preparation conditions | | Aggregate of carbon black | | |
|---|---|---|---|---|---|
| | Dispersant | Heating treatment | Immediately after preparation | After 30 days | After 60 days |
| Comparative Example 2-1 | None | None | X | X | X |
| Example 2-1 | PVP | None | ○ | Δ | X |
| Example 2-2 | PVP | 50° C. | ○ | ○ | Δ |
| Example 2-3 | PVP | 120° C. | ⊚ | ○ | ○ |
| Example 2-4 | Modified PVP | 120° C. | ⊚ | ⊚ | ⊚ |
| Example 2-5 | Modified acrylic | 120° C. | Δ | Δ | X |

X: Aggregated.
Δ: Slightly aggregated.
○: Good dispersibility.
⊚: Very good dispersibility.

TABLE 4

| | Preparation conditions | | Aggregate of carbon black | | |
|---|---|---|---|---|---|
| | Dispersant | Heating treatment | Immediately after preparation | After 30 days | After 60 days |
| Comparative Example 2-1 | None | None | X | X | X |
| Example 2-1 | PVP | None | ○ | Δ | X |
| Example 2-2 | PVP | 50° C. | ○ | ○ | Δ |
| Example 2-3 | PVP | 120° C. | ⊚ | ○ | ○ |
| Example 2-4 | Modified PVP | 120° C. | ⊚ | ⊚ | ⊚ |
| Example 2-5 | Modified acrylic | 120° C. | Δ | Δ | X |

X: Aggregated.
Δ: Slightly aggregated.
○: Good dispersibility.
⊚: Very good dispersibility.

TABLE 5

| Preparation conditions | | Surface smoothness | | |
|---|---|---|---|---|
| Dispersant | Heating treatment | Immediately after preparation | After 30 days | After 60 days |
| Comparative Example 2-1 | None | None | X | X | X |
| Example 2-1 | PVP | None | ○ | Δ | X |
| Example 2-2 | PVP | 50° C. | ○ | ○ | Δ |
| Example 2-3 | PVP | 120° C. | ⊚ | ○ | ○ |
| Example 2-4 | Modified PVP | 120° C. | ⊚ | ⊚ | ⊚ |
| Example 2-5 | Modified acrylic | 120° C. | Δ | Δ | X |

X: Bad.
Δ: Ordinary.
○: Good.
⊚: Very good.

TABLE 6

| Preparation conditions | | Aggregate of carbon black | | |
|---|---|---|---|---|
| Dispersant | Heating treatment | Immediately after preparation | After 30 days | After 60 days |
| Comparative Example 2-1 | None | None | ○ | X | X |
| Example 2-1 | PVP | None | ○ | Δ | Δ |
| Example 2-2 | PVP | 50° C. | ○ | ○ | Δ |
| Example 2-3 | PVP | 120° C. | ⊚ | ○ | ○ |
| Example 2-4 | Modified PVP | 120° C. | ⊚ | ⊚ | ⊚ |
| Example 2-5 | Modified acrylic | 120° C. | ○ | ○ | Δ |

X: Aggregated.
Δ: Slightly aggregated.
○: Good dispersibility.
⊚: Very good dispersibility.

Comparative Example 2-2

An amount of 100 parts by weight of polyamidic acid varnish, resultant from Synthetic Example 1-1, 4 parts by weight of poly(vinylpyrrolidone) K-90 (Wako Pure Chemical Industries, Ltd.), and 36 parts by weight of N-methyl-2-pyrrolidone were placed into a separable flask as equipped with a thermosensor, stirring vanes, and a condenser, and the resultant mixture was stirred at room temperature for 30 minutes to obtain a homogeneous solution, to which 10 parts by weight of carbon black MA100R (made by Mitsubishi Chemicals Corporation) and 800 parts by weight of zirconia-made beads were then added. The resultant mixture was stirred at 700 rpm at room temperature for 5 hours. Thereafter, the liquid was separated from the zirconia-made beads by filtration, thus obtaining carbon black-containing polyamidic acid varnish (2-B6). The dispersed state in the resultant liquid (2-B6) was observed with an optical microscope (of 400 magnifications). As a result, a lot of aggregates of the carbon black were seen.

Next, about 0.5 parts by weight of carbon black-containing polyamidic acid varnish (2-B6) was dropped onto a glass plate 50 mm square and 2 mm thick, and then the glass plate was rotated at 2,000 rpm with a spin coater (1H-D2, made by Mikasa Kabushiki Kaisha) for 1 minute to form membrane (2-C6) on the glass plate. Furthermore, membrane (2-C6) was left on a hot plate of 150° C. for 10 minutes, thereby evaporating the solvent. Next, membrane (2-C6) was heated at 200° C. for 30 minutes and then at 350° C. for 30 minutes with an oven to run a polyimidation reaction, thus obtaining polyimide membrane (2-D6).

The dispersed state of the carbon black in polyimide membrane (2-D6) was observed with an optical microscope (of 400 magnifications), with the result that the aggregates were found remaining not re-dispersed. In addition, whether the surface of the membrane was observed with the eye. As a result, the surface was found lusterless and rough.

Various details of the invention may be changed without departing from its spirit not its scope. Furthermore, the foregoing description of the preferred embodiments according to the present invention is provided for the purpose of illustration only, and not for the purpose of limiting the invention as defined by the appended claims and their equivalents.

What is claimed is:

1. A polyamidic acid-containing and fine particles-dispersed composition, which comprises fine particles and a polar solvent solution, wherein the fine particles are dispersed in the polar solvent solution using an organic polymer as a dispersant, and wherein the fine particles are carbon black and/or silica particles, with the composition further comprising a polyamidic acid.

2. A polyamidic acid-containing and fine particles-dispersed composition according to claim 1, wherein: the organic polymer is a polymer having an amino group and/or amide group.

3. A polyamidic acid-containing and fine particles-dispersed composition according to claim 1, wherein: the organic polymer is a polymer having an amide group.

4. A polyamidic acid-containing and fine particles-dispersed composition according to claim 1, wherein the organic polymer is a polymer having a structural unit of at least one kind selected from the group consisting of (meth)acrylamides, alkyl(meth)acrylamides and n-vinylamides.

5. A polyamidic acid-containing and fine particles-dispersed composition according to claim 1, wherein the organic polymer is a polymer having a structural unit of n-vinylamides.

6. A polyamidic acid-containing and fine particles-dispersed composition according to claim 1, wherein:
   the fine particles are carbon black;
   the organic polymer as a dispersant has a functional group reactable with the carbon black; and
   the carbon black is in the form of polymer-grafted carbon black modified with the organic polymer.

7. A polyamidic acid-containing and fine particles-dispersed composition according to claim 1, wherein:
   the fine particles are silica particles;
   the organic polymer as a dispersant has a functional group reactable with the silica particles; and
   the silica particles are in the form of polymer-grafted silica particles modified with the organic polymer.

8. A process for producing a polyamidic acid-containing and fine particles-dispersed composition, which comprises the steps of:
   dissolving an organic polymer into a polar solvent;
   adding fine particles to the resultant solution;
   dispersing the fine particles into this solution to prepare a fine particle dispersion; and
   mixing the resultant fine particle dispersion and a polyamidic acid solution;

wherein the fine particles are carbon black and/or silica particles.

9. A process according to claim 8, wherein the organic polymer is a polymer having an amino group and/or amide group.

10. A process according to claim 8, wherein the organic polymer is a polymer having an amide group.

11. A process according to claim 8, wherein the organic polymer is a polymer having a structural unit of at least one kind selected from the group consisting of (meth) acrylamides, alkyl(meth)acrylamides and N-vinylamides.

12. A process according to claim 8, wherein the organic polymer is a polymer having a structural unit of N-vinylamides.

13. A process according to claim 8, wherein the step of dispersing the fine particles is carried out in a heated state.

14. A process for producing a polyamidic acid-containing and fine particles-dispersed composition, which comprises the steps of:

dissolving an organic polymer into a polar solvent;

adding fine particles to the resultant solution;

dispersing the fine particles into this solution to prepare a fine particle dispersion; and polymerizing a tetracarboxylic dianhydride along with a diamine and/or diisocyanate as raw materials in the fine particle dispersion to prepare a polyamidic acid;

wherein the fine particles are carbon black and/or silica particles.

15. A process according to claim 14, wherein the organic polymer is a polymer having an amino group and/or amide group.

16. A process according to claim 14, wherein the organic polymer is a polymer having an amide group.

17. A process according to claim 14, wherein the organic polymer is a polymer having a structural unit of at least one kind selected from the group consisting of (meth) acrylamides, alkyl(meth)acrylamides and N-vinylamides.

18. A process according to claim 14, wherein the organic polymer is a polymer having a structural unit of N-vinylamides.

19. A process for producing a fine particles-dispersed composition, wherein the fine particles-dispersed composition comprises fine particles and a polar solvent solution, wherein the fine particles are carbon black and/or silica particles, and wherein the process further comprises the step of dispersing the fine particles into the polar solvent solution using an organic polymer as a dispersant in a heated state.

20. A process according to claim 19, wherein the temperature of the step of dispersing is in the range of 40–200° C.

21. A process according to claim 19, wherein the organic polymer is a polymer having an amino group and/or amide group.

22. A process according to claim 19, wherein the organic polymer is a polymer having an amide group.

23. A process according to claim 19, wherein the organic polymer is a polymer having a structural unit of at least one kind selected from the group consisting of (meth) acrylamides, alkyl(meth)acrylamides and N-vinylamides.

24. A process according to claim 19, wherein the organic polymer is a polymer having a structural unit of N-vinylamides.

25. A process according to claim 19, wherein:

the fine particles are carbon black;

the organic polymer as a dispersant has a functional group reactable with the carbon black; and the carbon black is in the form of polymer-grafted carbon black modified with the organic polymer.

26. A process for producing a fine particles-dispersed composition, wherein the fine particles-dispersed composition comprises fine particles and a polar solvent solution, and wherein the fine particles are silica particles, wherein the process comprises the step of dispersing the fine particles into the polar solvent solution using an organic polymer as a dispersant, wherein the organic polymer as a dispersant has a functional group reactable with the silica particles; and the silica particles are in the form of polymer-grafted silica particles modified with the organic polymer.

27. A process according to claim 26, wherein the organic polymer is a polymer having an amino group and/or amide group.

28. A process according to claim 26, wherein the organic polymer is a polymer having an amide group.

29. A process according to claim 26, wherein the organic polymer is a polymer having a structural unit of at least one kind selected from the group consisting of (meth) acrylamides, alkyl(meth)acrylamides and N-vinylamides.

30. A process according to claim 26, wherein the organic polymer is a polymer having a structural unit of N-vinylamides.

* * * * *